United States Patent [19]

Isobe et al.

[11] Patent Number: 5,187,559
[45] Date of Patent: Feb. 16, 1993

[54] SEMICONDUCTOR DEVICE AND PROCESS FOR PRODUCING SAME

[75] Inventors: Yoshihiko Isobe, Toyoake; Makio Iida, Ichinomiya, both of Japan

[73] Assignee: Nippondenso Co., Ltd., Kariya, Japan

[21] Appl. No.: 661,240

[22] Filed: Feb. 27, 1991

[30] Foreign Application Priority Data

Feb. 28, 1990 [JP] Japan .................................. 2-50008
Nov. 27, 1990 [JP] Japan ................................ 2-328213

[51] Int. Cl.⁵ .................... H01L 29/04; H01L 27/02; H01L 29/167
[52] U.S. Cl. .................................. 257/538; 257/607
[58] Field of Search ......................... 357/59, 51, 63

[56] References Cited

U.S. PATENT DOCUMENTS 4,210,996 7/1980 Amemiya et al. ................... 29/610

FOREIGN PATENT DOCUMENTS 53-136980 11/1978 Japan .
2-42760 2/1990 Japan .

OTHER PUBLICATIONS

Kato, Kotaro et al., "Electrical Trimming of Heavily Doped Polycrystalline Silicon Resistors", Musashino Electrical Communication Laboratory, Technical Report SSD79-16, Institute of Electronic Communication, 1979, pp. 31-38.

Primary Examiner—Mark V. Prenty
Attorney, Agent, or Firm—Cushman, Darby & Cushman

[57] ABSTRACT

A semiconductor device provided with a polycrystalline silicon resistor containing an impurity in a high concentration and having a resistance adjusted by a current conduction therethrough at a current density of a threshold value or more, which comprises: a polycrystalline silicon resistor containing a first impurity having a negative value of a temperature coefficient of resistance in a high impurity concentration region of said polycrystalline silicon resistor and a second impurity having a positive value of a temperature coefficient of resistance in a high impurity concentration region of the polycrystalline silicon resistor. A process for producing same is also disclosed.

3 Claims, 6 Drawing Sheets

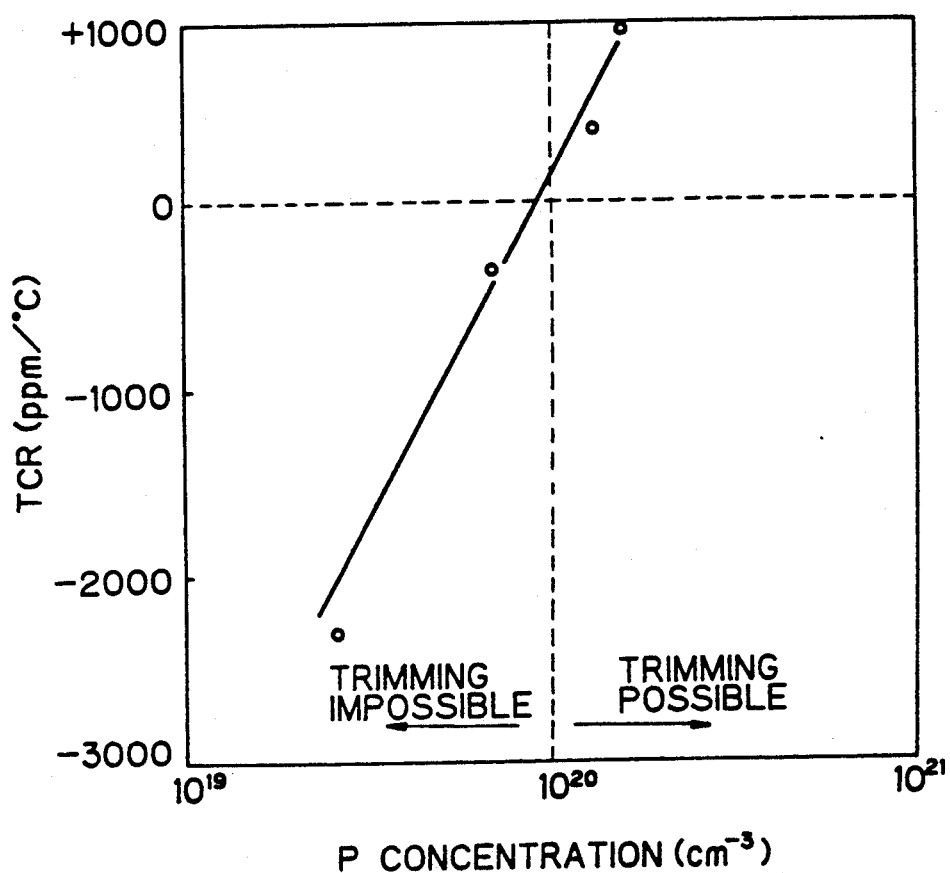

SEMICONDUCTOR DEVICE AND PROCESS FOR PRODUCING SAME

BACKGROUND OF THE INVENTION

1. Field of the Invention

The present invention relates to a semiconductor device, particularly a semiconductor device provided with a polycrystalline silicon resistor in which trimming is possible.

2. Description of the Related Art

It is known from "Technical Report SSD79-16" issued by the Institute of Electronic Communication (1979) that the resistance of a polycrystalline silicon resistor containing a large amount of impurities is adjustable by conducting an electric current therethrough at a current density of a threshold value or more, and that the polycrystalline silicon resistor must contain an impurity at a concentration of $10^{20}$ cm$^{-3}$ or more.

In a high precision integrated circuit (IC), such a polycrystalline silicon resistor also serves as a high precision standard resistor and must have a temperature coefficient of resistance (TCR) of zero. Nevertheless, a problem arises in that the zero TCR value cannot be obtained in an impurity concentration region in which trimming is possible, and thus a conventional trimmable polycrystalline silicon resistor of a high precision IC cannot simultaneously have both a zero TCR value and a good trimming property, i.e., a high rate of resistance change.

SUMMARY OF THE INVENTION

The object of the present invention is to provide a semiconductor device provided with a polycrystalline silicon resistor having both a good trimming property (a high rate of resistance change) and a zero TCR value.

To achieve the object according to the present invention, there is provided a semiconductor device provided with a polycrystalline silicon resistor containing an impurity in a high concentration and having a resistance adjusted by a current conduction therethrough at a current density of a threshold value or more, which comprises:

a polycrystalline silicon resistor containing a first impurity having a negative value of a temperature coefficient of resistance in a high impurity concentration region of the polycrystalline silicon resistor, and a second impurity having a positive value of a temperature coefficient of resistance in a high impurity concentration region of the polycrystalline silicon resistor.

According to the present invention, the first impurity, having a negative value of a temperature coefficient of resistance in a high impurity concentration region of the polycrystalline silicon resistor, is preferably present in a "saturation concentration" which falls within a range in which a variation of the temperature coefficient of resistance is saturated, i.e., the temperature coefficient of resistance does not vary, with respect to the impurity concentration, in the high impurity concentration region.

According to the present invention, the saturation concentration of the first impurity in the high impurity concentration region is $2.7 \times 10^{20}$ cm$^{-3}$ or higher when the first impurity having a negative temperature coefficient of resistance is arsenic; and the second impurity having a positive temperature coefficient of resistance and coexisting with the arsenic is phosphorous present in a concentration of $2.3 \times 10^{19}$ to $4.5 \times 10^{19}$ cm$^{-3}$.

The present invention also provides a process for producing a semiconductor device provided with a polycrystalline silicon resistor containing an impurity in a high concentration and having a resistance adjusted by a current conduction therethrough at a current density of a threshold value or more, which comprises the steps of:

a first step of forming a polycrystalline silicon resistor containing a first impurity having a negative value of a temperature coefficient of resistance in a high impurity concentration region of the polycrystalline silicon resistor and a second impurity having a positive value of a temperature coefficient of resistance in a high impurity concentration region of the polycrystalline silicon resistor; and a second step of adjusting the resistance of the polycrystalline silicon resistor by applying an electric current of a threshold current density value or more to the polycrystalline silicon resistor.

In the present inventive process, the first impurity, having a negative value of a temperature coefficient of resistance in the high impurity concentration region of the polycrystalline silicon resistor, is preferably contained in a "saturation concentration" which falls within a range in which a variation of the temperature coefficient of resistance is saturated, i.e., the temperature coefficient of resistance does not vary, with respect to the impurity concentration, in the high impurity concentration region.

In the present inventive process, in the first step, the second impurity, having a positive value of a temperature coefficient of resistance, is preferably doped to the polycrystalline silicon resistor by a thermal diffusion.

The present invention also provides a semiconductor device provided with a polycrystalline silicon resistor containing an impurity in a high concentration and having a resistance adjusted by a current conduction therethrough at a current density of a threshold value or more, which comprises:

a polycrystalline silicon resistor containing a first impurity which would impart a negative temperature coefficient of resistance to the resistor when solely contained in a high concentration and a second impurity which would impart a positive temperature coefficient of resistance to the resistor when solely contained in a high concentration.

The polycrystalline silicon resistor preferably contains the first and second impurities in concentrations that collectively impart a temperature coefficient of resistance of substantially zero to the resistor.

The first impurity is preferably contained in a concentration range in which the temperature coefficient of resistance of the resistor does not substantially vary with respect to the first impurity concentration.

The first impurity is arsenic having the concentration range of $2.7 \times 10^{20}$ cm$^{-3}$ or higher in which the temperature coefficient of resistance of the resistor does not substantially vary with respect to the arsenic concentration; and the second impurity is phosphorous in a concentration of from $2.3 \times 10^{19}$ to $4.5 \times 10^{19}$ cm$^{-3}$.

The present invention also provides a process for producing a semiconductor device provided with a polycrystalline silicon resistor containing an impurity in a high concentration and having a resistance adjusted by a current conduction therethrough at a current density of a threshold value or more, which comprises the steps of:

a first step of forming a polycrystalline silicon resistor containing a first impurity which would impart a negative temperature coefficient of resistance to the resistor when solely contained in a high concentration and a second impurity which would impart a positive temperature coefficient of resistance to the resistor when solely contained in a high concentration; and a second step of adjusting the resistance of the polycrystalline silicon resistor by applying an electric current of a threshold current density or more to the polycrystalline silicon resistor.

The first step preferably comprises doping the second impurity to a polycrystalline silicon by a thermal diffusion, after doping the first impurity to the polycrystalline silicon.

BRIEF DESCRIPTION OF THE DRAWINGS

FIG. 5 is a graph showing a relationship between the phosphorous concentration and the temperature coefficient of resistance value;

DESCRIPTION OF THE PREFERRED EMBODIMENTS

Figure 4:
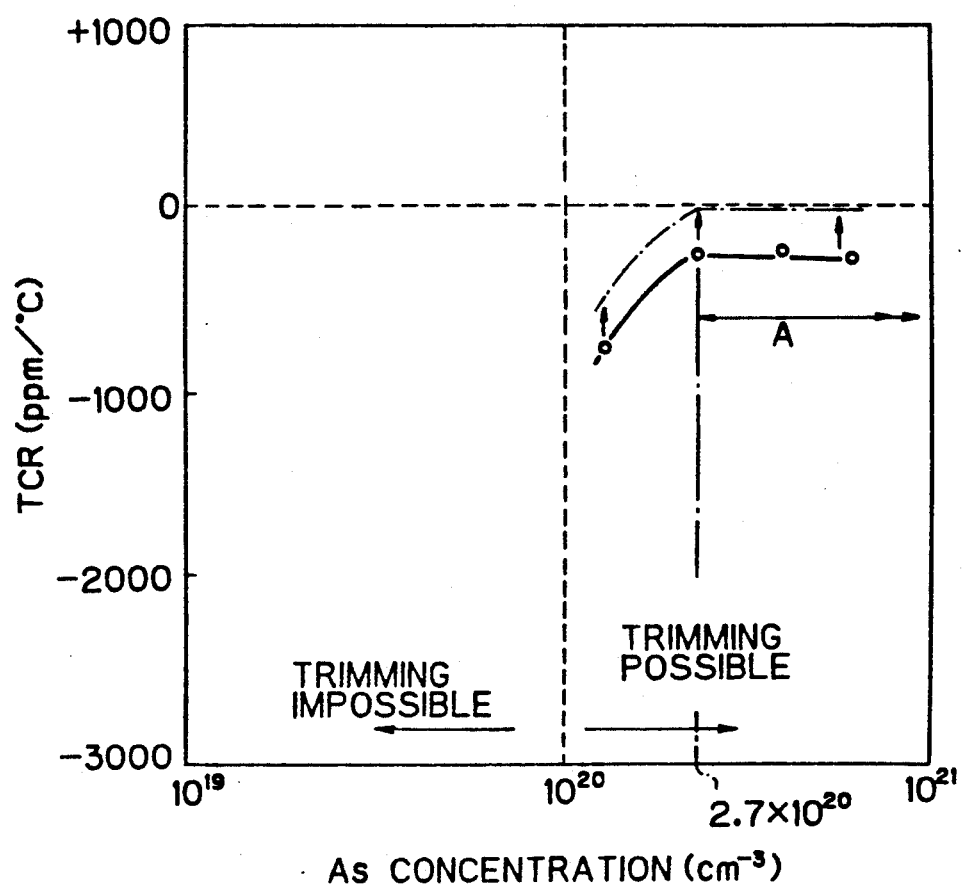
FIG. 4 is a graph showing a relationship between the arsenic concentration and the temperature coefficient of resistance value.

The present invention provides a semiconductor device provided with a polycrystalline silicon resistor having a temperature coefficient of resistance (TCR) of approximately zero, because the present inventive polycrystalline silicon resistor contains both a first impurity having a negative TCR, such as arsenic as shown in FIG. 4, and a second impurity having a positive TCR, such as phosphorous as shown in FIG. 5. According to the present invention, a second impurity having a positive TCR is segregated on the crystal grain boundaries much more than in the crystal grains in a polycrystalline silicon resistor. For example, an arsenic-doped polycrystalline silicon resistor as a whole has a negative TCR, because arsenic is segregated on the grain boundaries less than in the grains and because the resistance of grain boundaries having a negative TCR makes a more significant contribution than that of grains having a positive TCR. This negative TCR is shifted to a value of approximately zero by the doping of phosphorous having a positive TCR as shown in FIG. 5. The thus shifted TCR is shown in FIG. 4 by a dotted curve approximating the zero level of a horizontal broken line.

In a preferred embodiment of the present invention, the zero-approximated TCR value is very stable, i.e., it is not effected by any small variation of the impurity concentration (the arsenic concentration, for example), because the zero TCR is achieved by doping the impurity at a "saturation concentration" which falls within a range in which the TCR value is saturated or does not vary with respect to the impurity concentration. Such a range in which the TCR value is saturated or remains unchanged is exemplified by the saturation region "A" of FIG. 4.

Figure 8:
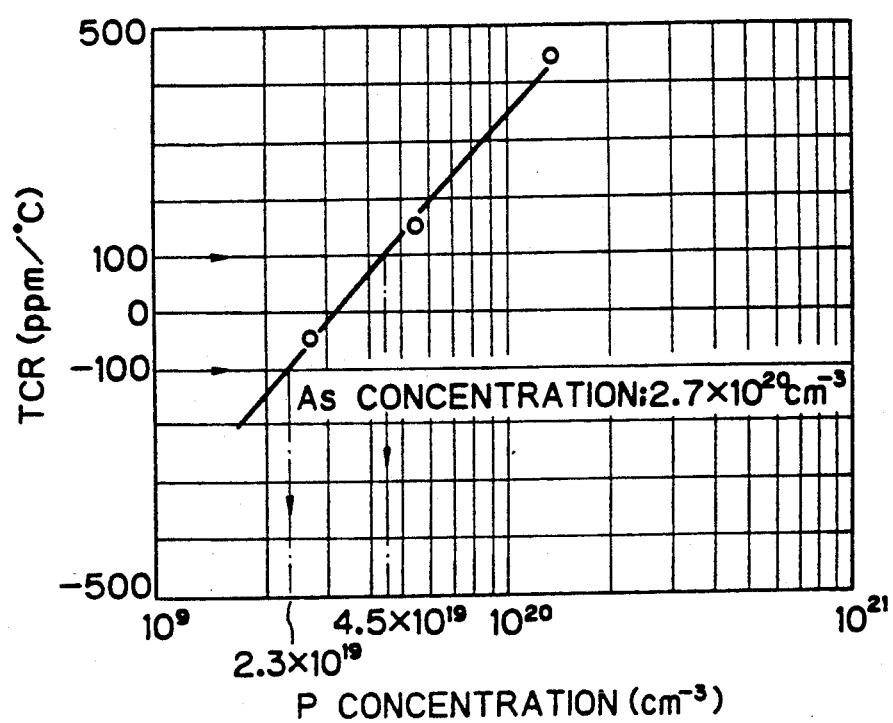
FIG. 8 is a graph showing a relationship between the phosphorous concentration and the temperature coefficient of resistance.

In another preferred embodiment of the present invention, such a saturation region is obtained at a saturation concentration of $2.7 \times 10^{20}$ cm$^{-3}$ or more of arsenic as an impurity having a negative TCR as shown in FIG. 4, and under this arsenic concentration, a concentration of $2.3 \times 10^{19}$ to $4.5 \times 10^{19}$ cm$^{-3}$ of phosphorous as an impurity having a positive TCR as shown in FIG. 8 ensures a TCR value of within $0 \pm 100$ ppm/° C.

The present inventive process produces a semiconductor device according to the present invention.

A preferred embodiment of the present inventive process uses the saturation region "A" for arsenic as shown in FIG. 4 to produce a preferred embodiment of the present inventive semiconductor device provided with a polycrystalline silicon resistor having a zero-approximated TCR value.

Another preferred embodiment of the present inventive process uses a thermal diffusion technique to ensure an easy segregation of an impurity at the grain boundaries in a polycrystalline silicon resistor. Example The preferred embodiments of the present invention will be described in further detail by way of examples.

Figure 1:
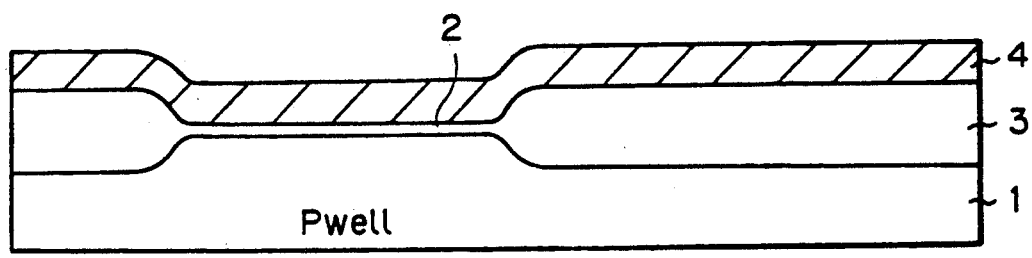
FIGS. 1 and 2 show sectional views of process steps for producing a semiconductor device according to the present invention.

Referring to FIG. 1, in a P-type single crystal silicon substrate 1, a gate oxide film 2 and a field oxide film 3 are formed by a usual CMOS-production process. A 0.37 μm thick polycrystalline silicon 4 is deposited on the gate oxide film 2 and the field oxide film 3, to cover these films, by a chemical vapor deposition process. Arsenic as an impurity is doped to the polysilicon 4 by an ion implantation carried out at an energy of 100 keV and a dose of $1.5 \times 10^{16}$ cm$^{-2}$.

The arsenic dose falls within the saturation region "A" present in the arsenic concentration range of $10^{20}$ cm$^{-3}$ or more in which trimming is possible, as shown in FIG. 4. The arsenic saturation region "A" is actually $2.7 \times 10^{20}$ cm$^{-3}$.

Phosphorous, which is also one of the N-type impurities including arsenic, is then thermally diffused into the polycrystalline silicon 4 at 980° C. for 10 minutes. This thermal diffusion ensures a selective doping of phosphorous, which shows a greater segregation at the crystal grain boundaries of the polycrystalline silicon 4 than arsenic. The tendency to segregate at the grain boundaries is represented by the segregation coefficient, such as 0.9 for boron, 0.35 for phosphorous, 0.30 for arsenic, 0.04 for antimony, $5 \times 10^{-4}$ for indium.

Figure 2:
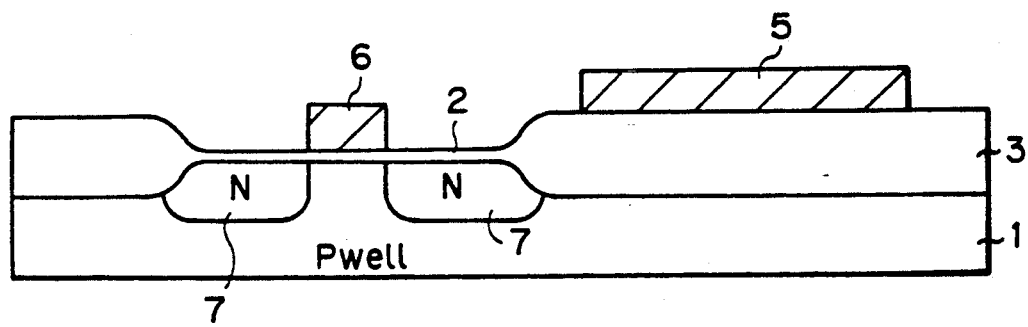

Referring to FIG. 2, the polycrystalline silicon 4 is patterned by photolithography and etching to remove the polycrystalline silicon 4 in the portions other than a polycrystalline silicon resistor 5, in a region in which a resistor is to be formed above the field oxide film 3 and a polycrystalline silicon gate 6 in a region in which a gate electrode of a MOS-transistor is to be formed.

To activate the implanted or doped impurity, the polycrystalline silicon resistor 5 and the polycrystalline silicon gate 6 are then oxidized and annealed at 1000° C. for 20 pk minutes in $O_2$ and for 50 minutes in $N_2$, and arsenic then implanted into the silicon substrate 1 to form N-type source and drain regions 7.

Figure 3:
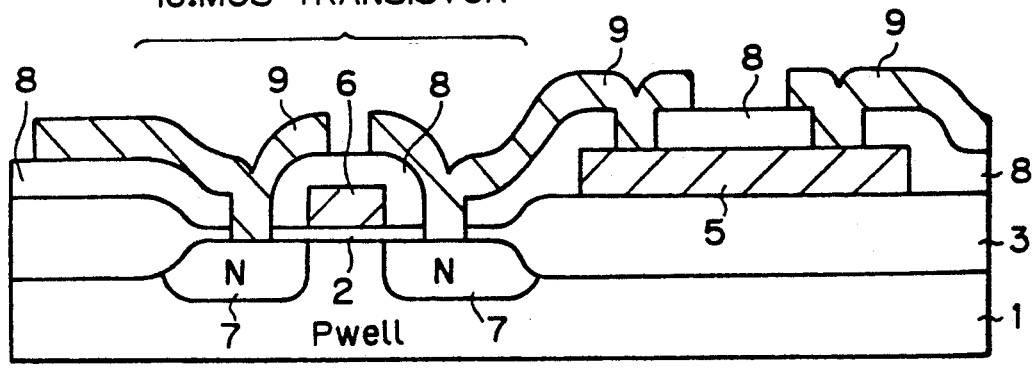
FIG. 3 shows sectional views of a semiconductor device according to the present invention.

Referring to FIG. 3, an interlayer insulation film 8 is deposited on the silicon substrate 1 by a chemical vapor deposition. After forming a contact hole by a usual photolithography and etching, a conductor metal 9 is deposited by sputtering and patterned by a usual photolithography and etching.

This provides a structure in which a MOS-transistor 10 and the polycrystalline silicon resistor 5 are connected in series.

Thereafter, a voltage is applied to the polysilicon gate 6 of the MOS-transistor 10 to turn on the MOS-transistor 10. While the transistor 10 is turned on, a current is applied to the polycrystalline silicon resistor 5 at a current density of a threshold value or more to adjust the resistance of the resistor 5. The applied current of a threshold value or more causes a local fusion of the grain boundaries, which then solidify when the current application is terminated, with the result that impurities segregate in the thus-solidified region to form a region in which impurities are highly concentrated, which reduces the overall resistance of the resistor 5. The current density of a threshold value or more used herein is about $1 \times 10^6 A/cm^2$.

Figure 6:
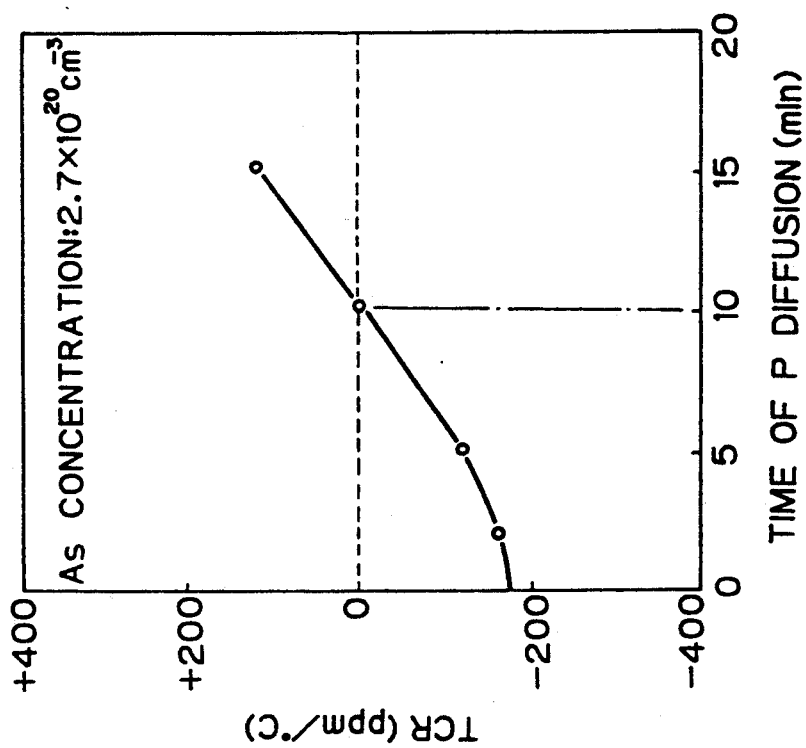
FIG. 6 is a graph showing a relationship between the duration time of phosphorous diffusion and the temperature coefficient of resistance.

FIG. 6 shows a relationship between the duration time of thermal diffusion of phosphorous into the polycrystalline silicon resistor 5 and the temperature coefficient of resistance, TCR, of the polycrystalline silicon resistor 5. The polycrystalline silicon resistor 5 has an As concentration of $2.7 \times cm^{-3}$. It can be seen from FIG. 6 that a thermal diffusion of phosphorous for 10 minutes enables a TCR value of zero to be obtained. This is achieved by a selective diffusion of phosphorous to the grain boundaries of the polycrystalline silicon resistor 5.

Figure 7:
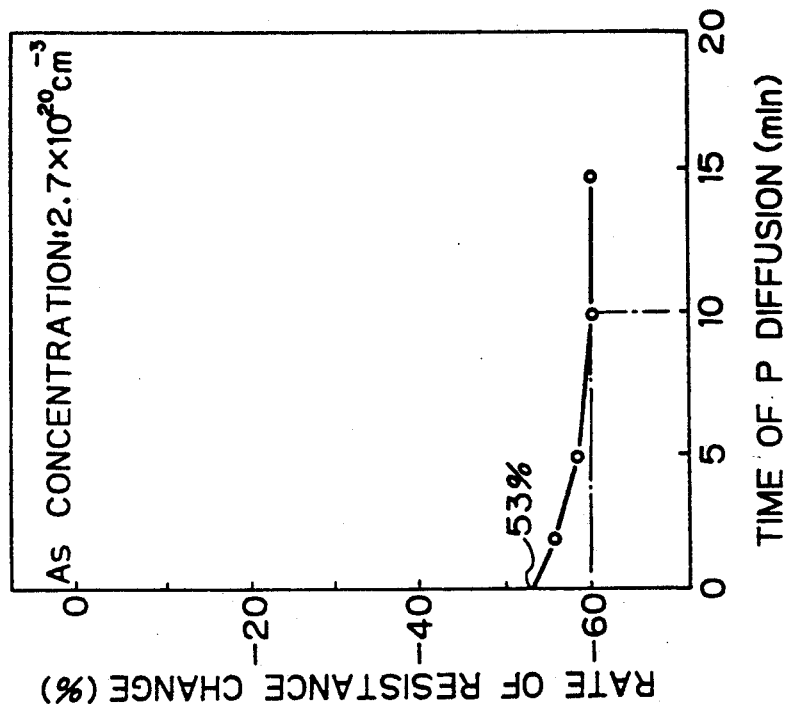
FIG. 7 is a graph showing a relationship between the duration time of phosphorous diffusion and the rate of resistance change.

FIG. 7 shows a relationship between the duration time of thermal diffusion of phosphorous into the polycrystalline silicon resistor 5 and the rate of resistance change obtained by trimming. The polycrystalline silicon resistor 5 has an As concentration of $2.7 \times cm^{-3}$. When the thermal diffusion is carried out for 10 minutes as herein exemplified, the resistance is reduced by 60% by trimming, which is greater than the resistance change of 53% obtained when the thermal diffusion of phosphorous into the polycrystalline silicon resistor 5 is not effected.

Thus, the present invention provides both a good temperature coefficient of resistance of approximately zero and a good trimming property.

This is achieved through the following principle, according to the present invention. In the polycrystalline silicon resistor 5, which is composed of grains and grain boundaries, the doped impurities have different grain boundary segregation coefficients and are present in grains and at grain boundaries in different concentrations, even when doped in the same amount. Accordingly, a polycrystalline silicon resistor 5 doped solely with arsenic has as an overall negative TCR, as shown by the solid curve in FIG. 4, because arsenic segregates at the grain boundaries less than in the grains so that the resistance of the grain boundaries having a negative TCR makes a more significant contribution than that of the grains having a positive TCR. When phosphorous is implanted to the arsenic-doped polycrystalline silicon resistor as an impurity having a greater grain boundary segregation coefficient than arsenic, the grain boundaries are selectively or preferentially doped with phosphorous to shift the overall TCR of the resistor in the positive direction. More concretely, when phosphorous, which has a positive TCR as shown in FIG. 5, is doped to the grain boundaries of the arsenic-doped polycrystalline silicon resistor 5, the effect of the grain boundary resistance becomes smaller and the TCR of the resistor 5 becomes close to zero, as shown by the dotted curve in FIG. 4.

In this example, a trimmable polycrystalline silicon resistor 5 having a TCR value of approximately zero has an arsenic concentration of grains of from 0.1 to 1 at% and a phosphorous concentration of grain boundaries of from 0.4 to 4 at%.

As described above, in the first process step, a polycrystalline silicon resistor 5 is doped with a first impurity (arsenic, in this example) having a negative value of a temperature coefficient of resistance in a high impurity concentration region of the resistor 5 in which region trimming is possible, and is then doped with a second impurity (phosphorous, in this example) having a positive value of a temperature coefficient of resistance in a high impurity concentration region of the resistor 5 in which region trimming is possible; and in the second process step, the resistance of the resistor 5 is adjusted by conducting therethrough an electric current at a current density of a threshold value or more.

This produces a high precision IC provided with a trimmable polycrystalline silicon resistor having a total impurity concentration of about $10^{20} cm^{-3}$ or more, i.e., a high precision IC provided with polycrystalline silicon resistor containing arsenic, having a negative value of a temperature coefficient of resistance in a high impurity concentration region of the polycrystalline silicon register, and phosphorous, having a positive value of a temperature coefficient of resistance in a high impurity concentration region of the polycrystalline silicone resistor. The polycrystalline silicon resistor has a temperature coefficient of resistance adjusted to substantially zero.

It is generally observed that, when an impurity is doped to a polycrystalline silicon resistor, the temperature coefficient of resistance is saturated when the impurity concentration reaches a certain amount or more, as exemplified by the saturation region "A" of FIG. 4, in which arsenic is used as the impurity. This means that doping of a polycrystalline silicon resistor with arsenic in an amount falling within the saturation region "A" and phosphorous enables the temperature coefficient of resistance to be zero in the saturation region "A", to thus stabilize the temperature coefficient of resistance which is therefore not affected by small fluctuations of the impurity concentration.

The doping of phosphorous by thermal diffusion is advantageous in that phosphorous readily enters the grain boundaries of a polycrystalline silicon. The grain boundaries of a polycrystalline silicon have many unoccupied bonding sites of silicon and have a high surface energy, and therefore, an impurity, when introduced from the polycrystalline silicon surface by thermal diffusion, diffuses along the grain boundaries. Thus, thermal diffusion is more advantageous for causing an impurity to enter the grain boundaries than ion implantation, in which the same physical amount of doping is obtained for grains and grain boundaries.

In the present invention, however, the method of doping impurities is not limited to thermal diffusion, and ion implantation may be used, the latter having a superior controllability of the doped impurity amount.

FIG. 8 shows a relationship between the phosphorous concentration and the temperature coefficient of resistance when phosphorous is doped after arsenic has been doped in a concentration of $2.7 \times cm^{31\ 3}$, which falls within the saturation region "A" as shown in FIG. 4. It is seen from FIG. 8 that the TCR value can be adjusted to $\pm 100$ ppm/° C. when phosphorous having a positive TCR value is doped at a concentration of from $2.3 \times 10^{19}$ to $4.5 \times 10^{19}$ cm$^{-3}$. The TCR value of $\pm 100$ ppm/° C. satisfies $\pm 10000$ ppm in the temperature range of $-25°$ C. to $+125°$ C. with respect to a room temperature of 25° C., as required by an IC specification of controllers used for automobiles.

Figure 9:
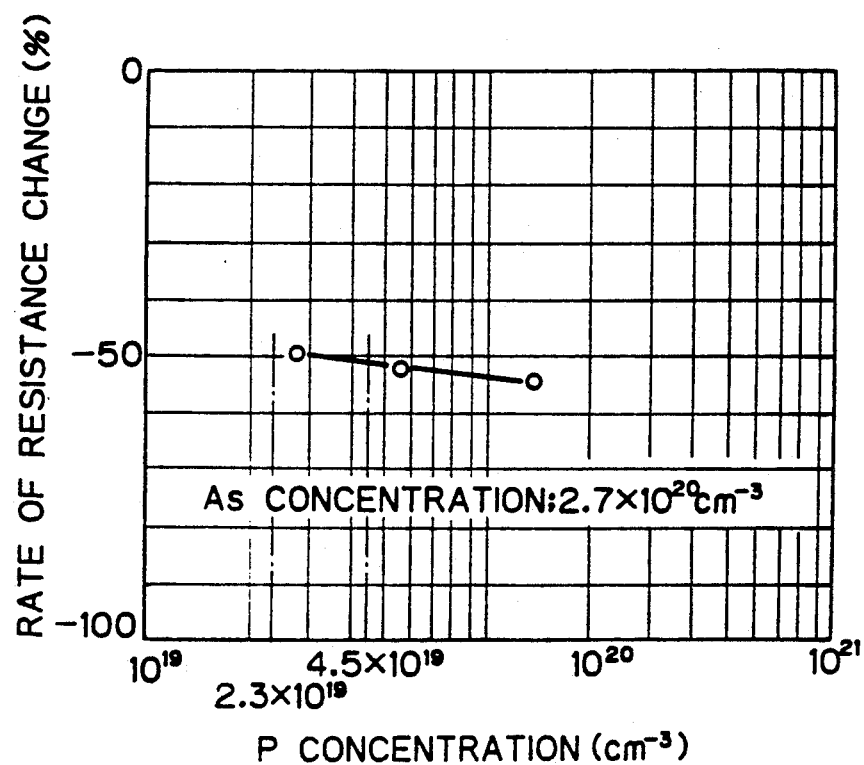
FIG. 9 is a graph showing a relationship between the phosphorous concentration and the rate of resistance change.

FIG. 9 shows a relationship between the phosphorous concentration and the rate of resistance change when phosphorous is doped after arsenic has been doped in a concentration of $2.7 \times cm^{-3}$, which falls within the saturation range "A", from which it is proved that the resistance can be reduced by about 50% when phosphorous is doped at a concentration of from $2.3 \times 10^{19}$ to $4.5 \times 10^{19}$ cm$^{-3}$.

In another embodiment of the present invention, it is possible to use indium, which is P-type impurity and segregates less at the grain boundaries, and boron, which segregates much more at the grain boundaries. In this case, indium may be doped to a polycrystalline silicon in a concentration of from 0.1 to 1 at% and boron may be then doped so that the boron concentration at grain boundaries is 0.4 to 4 at%. Boron and indium are preferably doped by ion implantation having a better controllability of impurity amount than thermal diffusion, though both processes may be used because these impurities have very different grain boundary segregation coefficients.

Three or more impurities may be used for doping of a polycrystalline silicon.

A polycrystalline silicon in which impurities having negative and positive TCR values have been doped may be annealed to enhance the segregation of impurities on the grain boundaries thereof.

Instead of doping a polycrystalline silicon with impurities having negative and positive TCR values, an amorphous silicon can be doped with impurities and then crystallized. Referring to FIG. 1, after a gate oxide film 2 and a field oxide film 3 are formed on a single crystal silicon substrate 1, an amorphous silicon is formed on the gate oxide film 2 and the field oxide film 3 by a low temperature deposition carried out at a temperature of 500° C. or lower. Impurities are doped in the amorphous silicon, which is then annealed at a high temperature (1000° C., for example) to convert the amorphous silicon to a polycrystalline silicon. When the doping of an impurity is carried out by thermal diffusion, the amorphous silicon is crystallized during the thermal diffusion.

The total concentration of doped impurities is about $10^{20}$cm$^{-3}$ or more. For example, arsenic and phosphorous are doped so that the sum of the concentrations thereof amounts to about $10^{20}$ cm$^{-3}$ or more.

As described above, the present invention provides a semiconductor device provided with a polycrystalline silicon resistor having both a good trimming property (a high rate of resistance change) and a temperature coefficient of resistance of substantially zero.

We claim:

1. A semiconductor device provided with a polycrystalline silicon resistor having an impurity in a high concentration and having a resistance adjusted by a current conduction therethrough at a current density of a threshold value or more, which comprises:

a polycrystalline silicon resistor having a first impurity comprising arsenic, having a negative value of a temperature coefficient of resistance in a high impurity concentration region of said polycrystalline silicon resistor and a second impurity comprising phosphorous, having a positive value of a temperature coefficient of resistance in said high impurity concentration region of said polycrystalline silicon resistor, said first impurity having a saturation concentration within a range in which a variation of the temperature coefficient of resistance which si saturated with respect to the impurity concentration in said high impurity concentration region, said saturation concentration of said first impurity in said high impurity concentration region is $2.7 \times 10^{20}$ cm$^{-3}$ or higher; and said second impurity having a positive temperature coefficient of resistance is at a concentration of from $2.3 \times 10^{19}$ to $4.5 \times 10^{19}$ cm$^{-3}$.

2. A semiconductor device provided with a polycrystalline silicon resistor having an impurity in a high concentration and having a resistance adjusted by a current conduction therethrough at a current density of a threshold value or more, which comprises:

a polycrystalline silicon resistor containing a first impurity wherein said first impurity is indium contained in a concentration of from 0.1 to 1 at% having a negative value of a temperature coefficient of resistance in a high impurity concentration region of said polycrystalline silicon resistor and a second impurity having a positive value of a temperature coefficient of resistance, wherein said second impurity is boron contained in a concentration of from 0.4 to 4 at% in terms of the boron concentration at the grain boundaries of said polycrystalline silicon, said first impurity having a saturation concentration within a range in which a variation of the temperature coefficient of resistance is saturated with respect to the impurity concentration in said high impurity concentration region.

3. A semiconductor device provided with a polycrystalline silicon resistor having gain impurity in a high concentration and having a resistance adjusted by a current conduction therethrough at a current density of a threshold value or more, which comprises:

a polycrystalline silicon resistor having a first impurity which would impart a negative temperature coefficient of resistance to said resistor when solely contained in a high concentration wherein said first impurity is arsenic having said concentration range of $2.7 \times 10^{20}$ cm$^{-3}$ or higher in which the temperature coefficient of resistance of said resistor does not substantially vary with respect to the arsenic concentration, and a second impurity which would impart a positive temperature coefficient of resistance to said resistor when solely contained in a high concentration, wherein said second impurity is phosphorous in a concentration of from $2.3 \times 10^{19}$ to $4.5 \times 10^{19}$ cm$^{-3}$ wherein said first impurity is contained in a concentration range in which the temperature coefficient of resistance of said resistor does not substantially vary with respect to the first impurity concentration.

* * * * *